(12) United States Patent
Braune et al.

(10) Patent No.: US 7,804,237 B2
(45) Date of Patent: Sep. 28, 2010

(54) LUMINESCENCE CONVERSION OF LED INCLUDING TWO PHOSPHORS

(75) Inventors: Bert Braune, Wenzenbach (DE); Frank Jermann, Königsbrunn (DE); Jörg Strauβ, Regensburg (DE)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 264 days.

(21) Appl. No.: 11/919,296

(22) PCT Filed: Apr. 11, 2006

(86) PCT No.: PCT/DE2006/000636

§ 371 (c)(1),
(2), (4) Date: Oct. 25, 2007

(87) PCT Pub. No.: WO2006/114077

PCT Pub. Date: Nov. 2, 2006

(65) Prior Publication Data

US 2009/0278441 A1  Nov. 12, 2009

(30) Foreign Application Priority Data

Apr. 26, 2005  (DE) .................. 10 2005 019 376

(51) Int. Cl.
H01J 1/62 (2006.01)
(52) U.S. Cl. .................. 313/501; 313/502; 313/503; 313/506; 313/512
(58) Field of Classification Search .......... 313/498–512
See application file for complete search history.

(56) References Cited

U.S. PATENT DOCUMENTS

| | | | |
|---|---|---|---|
| 6,580,097 B1 | 6/2003 | Soules et al. | |
| 6,642,652 B2 | 11/2003 | Collins, III et al. | |
| 6,682,663 B2 | 1/2004 | Botty et al. | |
| 6,686,691 B1 | 2/2004 | Mueller et al. | |
| 6,696,703 B2 | 2/2004 | Mueller-Mach et al. | |
| 6,717,353 B1 | 4/2004 | Mueller et al. | |
| 6,841,802 B2 | 1/2005 | Yoo | |
| 7,064,480 B2 | 6/2006 | Bokor et al. | |
| 2002/0030444 A1 | 3/2002 | Muller-Mach et al. | |
| 2002/0185965 A1 | 12/2002 | Collins, III et al. | |
| 2003/0024438 A1 | 2/2003 | Botty et al. | |
| 2003/0080341 A1* | 5/2003 | Sakano et al. ............... 257/79 |
| 2003/0214233 A1 | 11/2003 | Takahashi et al. | |
| 2004/0173806 A1 | 9/2004 | Chua | |
| 2004/0207998 A1 | 10/2004 | Suehiro | |
| 2004/0217692 A1* | 11/2004 | Cho et al. ............... 313/503 |
| 2006/0012299 A1* | 1/2006 | Suehiro et al. ............... 313/512 |

FOREIGN PATENT DOCUMENTS

| | | |
|---|---|---|
| DE | 100 36 940 | 2/2002 |
| EP | 1 449 264 | 9/2003 |
| EP | 1 441 395 | 7/2004 |
| EP | 1 480 278 | 11/2004 |
| WO | WO 99/50916 | 10/1999 |
| WO | WO 00/33390 | 6/2000 |
| WO | WO 01/40403 | 6/2001 |
| WO | WO 2004/030109 | 4/2004 |

* cited by examiner

Primary Examiner—Bumsuk Won
(74) Attorney, Agent, or Firm—Cohen Pontani Lieberman & Pavane LLP

(57) ABSTRACT

A luminescence conversion of LED, which uses a blue emitting chip and two illuminating substances, whereby one emits a red and the other a yellow to green. Both illuminating substances are separated upstream from the chip.

7 Claims, 2 Drawing Sheets

200
LUMINESCENCE CONVERSION OF LED INCLUDING TWO PHOSPHORS

RELATED APPLICATIONS

This is a U.S. national stage of application No. PCT/DE2006/000636, filed on 11 Apr. 2006.

This patent application claims the priority of German patent application no. 10 2005 019 376.5 filed 26 Apr. 2005, the disclosure content of which is hereby incorporated by reference.

FIELD OF THE INVENTION

The invention is related to a luminescence conversion LED having a radiation-emitting chip, the primary radiation of the chip being UV to blue and being at least partially converted into longer-wave radiation by a conversion element. It deals in particular with an LED with a high conversion efficiency.

BACKGROUND OF THE INVENTION

U.S. Pat. No. 6,686,691 has disclosed a luminescence conversion LED, in which the primary light source used is a blue chip. A phosphor layer containing two phosphors, which absorb blue and emit green and red, is connected ahead of the chip. In this case, however, the two phosphors are distributed homogenously in the resin, which leads to undesirable effects. It is accordingly not possible to satisfy the two criteria of "high efficiency" and "good color rendering" simultaneously. To achieve a high color rendering, either a green phosphor which actually has too short a wavelength has to be used, with this then being shifted by the strong absorption of the red phosphor, or the red phosphor has to be shifted as far as possible toward a long wavelength. Both solutions reduce efficiency on account of the high absorption in the first case and the low visual utility of the red radiation component in the second case.

WO 00/33390 has disclosed a luminescence conversion LED in which the primary light source used is a blue chip. A phosphor layer comprising two phosphors which absorb blue and emit green and red is connected ahead of the chip. The two phosphors can be used as a mixture or as separate layers.

U.S. Pat. No. 6,642,652 and U.S. Pat. No. 6,696,703 have each disposed a luminescence conversion LED in which the primary light source used is a blue chip. Two phosphor layers which absorb blue and emit green and red are connected ahead of the chip. In this case, the red phosphor layer is arranged directly on the substrate and the green phosphor layer is located directly above the red phosphor layer.

US 2004/169181 has disclosed a thin-film LED with phosphor.

SUMMARY OF THE INVENTION

It is an object of the present invention to provide a luminescence conversion LED which has a high conversion efficiency.

This and other objects are attained in accordance with an aspect of the present invention directed to a luminescence conversion LED having a radiation-emitting chip, the primary radiation of the chip being UV to blue and being at least partially converted into longer-wave radiation by a conversion element, wherein the conversion element comprises a separate arrangement of two phosphors, of which a first phosphor emits red and a second phosphor emits yellow to green, with only the first phosphor being applied directly to the chip.

The invention enables producing an LED with two phosphors, the reciprocal absorption with respect to the phosphor emission of which is significantly reduced compared to a standard potted LED. The following application-based problem is to be solved as a result: to produce an LED with very good color rendering, it is necessary to use more than one phosphor. A red phosphor and a green phosphor are generally required. Particularly preferred red phosphors (in particular in the case of a blue primary LED) are $Eu^{2+}$-activated compounds, such as $(Sr,Ca)_2Si_5N_8:Eu^{2+}$ (red) or $CaSiAlN_3:Eu^{2+}$. These phosphors have the property that their absorption extends into the orange-yellow spectral region. The absorption decreases with increasing wavelength. If a red phosphor of this type is now combined with a green or yellow phosphor in such a way that the two phosphors are uniformly dispersed in a resin, the red phosphor absorbs the emission of the green/yellow phosphor. The short-wave components are absorbed more strongly than the long-wave components. The effective emission of the green/yellow phosphor shifts toward a longer wavelength. This absorption process also has an adverse effect on the efficiency of the LED, since the absorbed light is not completely converted into red luminescent light. The generally undesirable shift in the green or yellow emission usually results in a deterioration in the color rendering compared to what would be expected without the shift.

One obvious approach to solving the problem consists in producing a thin-film LED 20 in which, as shown in FIG. 4, first of all a layer 21 of red phosphor and then a layer 22 of green phosphor are applied to the chip 23, in a similar way to that described in U.S. Pat. No. 6,686,691. However, in practice the production process is difficult to implement and leads to considerable color locus fluctuations in the LEDs produced.

By contrast, the process according to the invention allows the production of highly efficient LEDs with very good color rendering which also have a particularly homogenous radiation emission characteristic.

The process according to an embodiment of the invention involves applying a thin near-chip film, preferably with a thickness of at most 40 µm, in particular 10 to 40 µm, of a red phosphor (known as chip-level coating/on-chip coating) direct to the chip which emits with a short wavelength and may in particular have a peak wavelength in the range from 300 to 400 nm, i.e. in the UV to preferably blue radiation region, it being possible for the film to be applied, for example, by means of screen printing or electrophoresis. Various suitable methods are described in more detail in U.S. Pat. No. 6,686,691, the content of which is hereby incorporated by reference. This chip which has been coated in this way is either potted directly with potting resin containing converter or is introduced into a standard housing and potted inside this housing with a resin which contains only the green or yellow phosphor. In this configuration, the probability of green or yellow radiation from the second phosphor striking the red phosphor is very much lower than in the case of a homogenous mixture of the phosphors. The advantage is that the reabsorption decreases, whereas the efficiency of the LED rises. Moreover, the emission bands of particularly preferred phosphors, such as garnets (e.g. $(Y,Gd)_3(Al,Ga)_5O_{12}:Ce$ for good color rendering, Ra=80+) or alkaline-earth metal oxynitridosilicates, such as $SrSi_2O_2N_2:Eu^{2+}$ (very good color advantage is that the reabsorption decreases, whereas the efficiency of the LED rises. Moreover, the emission bands of particularly preferred phosphors, such as garnets (e.g. $(Y,Gd)_3(Al,Ga)_5O_{12}:Ce$ for good color rendering, Ra=80+) or alkaline-earth metal oxynitridosilicates, such as $SrSi_2O_2N_2$:$Eu^{2+}$ (very good color rendering Ra=85 and above), are scarcely shifted at all, so that higher color rendering indices Ra are achieved with higher efficiencies.

Preference is given to a design which uses a thin-film chip which is equipped with an integrated reflector, so that backscattered radiation is not lost.

DETAILED DESCRIPTION OF THE DRAWINGS

Figure 1:
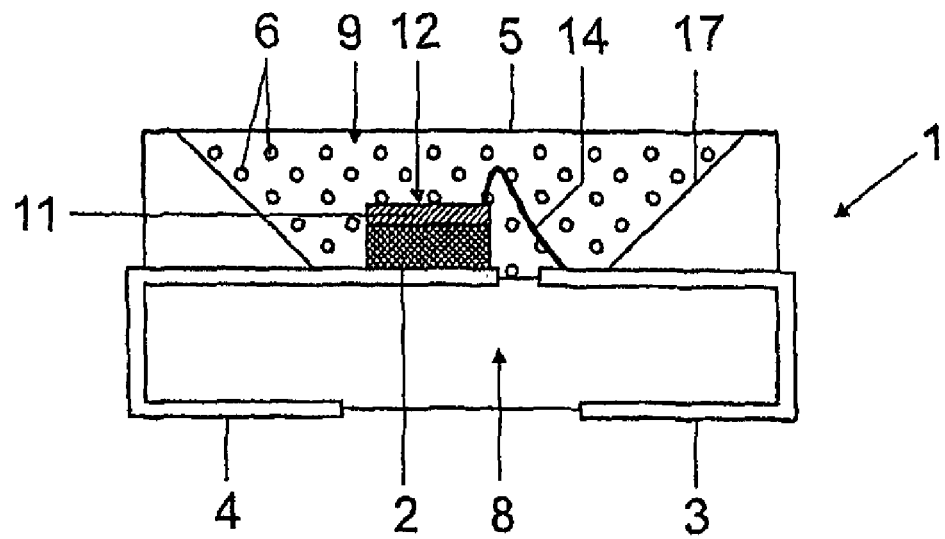
FIG. 1 shows a semiconductor component which serves as light source (LED) for white light.

By way of example, a structure which is fundamentally similar to that described in U.S. Pat. No. 5,998,925 (the content of which is hereby incorporated by reference) is used for a white LED together with an InGaN chip. The structure of a light source of this type for white light is specifically shown in FIG. 1. The light source is a semiconductor component 1 having a chip 2 of the InGaN type with a peak emission wavelength of 460 nm, i.e. in the blue, with first and second electrical terminals 3, 4, embedded in an opaque basic housing 8 in the region of a recess 9. One of the terminals 3 is connected to the chip 2 via a bonding wire 14. The recess has a wall 17 which serves as reflector for the blue primary radiation of the chip 2. The red phosphor is applied direct to the chip in the form of a thin film 11. This red phosphor is preferably a nitridosilicate of the $M_xSi_yN_z$:Eu type, where M=Ca, Sr, Ba, Zn. In this context, it is preferable that z=2/3x+4/3y. This phosphor is known per se, for example from EP 1 153 101 (Eu-red LED).

The layer thickness should preferably be less than 40 μm, in particular approximately 10 to 30 μm. This is advantageous to ensure that the blue radiation can partially penetrate through the layer 11. The recess 9 is filled with a potting compound 5, which as its main constituents contains silicone and green-emitting or yellow-emitting phosphor pigments 6. In a first embodiment, these phosphor pigments are yellow-emitting, preferably of the garnet type, for example YAG:Ce. One alternative is TbAG:Ce. Alternatively, the phosphor pigments may also be green-emitting, for example of the oxynitridosilicate type. One specific example is an alkaline-earth metal Sion, such as in particular $SrSi_2O_2N_2$:$Eu^{2+}$, with which overall a very good color rendering of Ra=85 or more can be achieved. The thickness of the potting compound is advantageously greater than 200 μm, and in particular it is approx. 300 to 500 μm, with the green-yellow-emitting second phosphor being distributed as homogenously as possible therein. To ensure layer thicknesses which are as uniform as possible with a high efficiency, it is recommended to use a mean grain size d50 which should be less than 15 μm and is in particular selected in the range from 5 to 12 μm. This phosphor is known per se, for example from EP-A 1449264.

Figure 2:
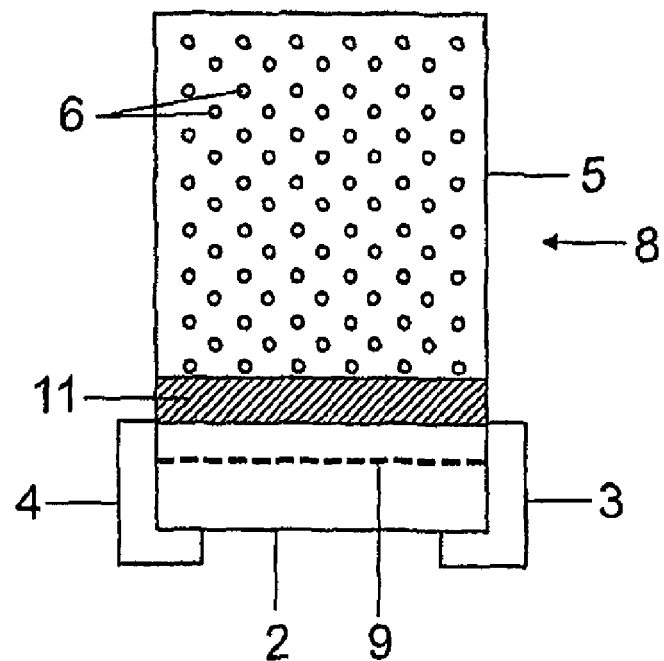
FIG. 2 shows a further exemplary embodiment of a semiconductor component.

FIG. 2 shows an alternative embodiment of a semiconductor component 8 which does not use a housing. In this case, the potting compound 5 containing the second phosphor 6 rests directly on the chip 2 and the first thin film 11 of the red phosphor, without a housing being used. A reflector 9 is integrated in the chip 2, in a manner which is known per se, but with a particularly advantageous action in connection with the concept of using the two phosphors in accordance with the invention.

In this context, the crucial factor is always that the red-emitting phosphor, generally a nitridosilicate, forms the first layer 11, which is applied direct to the chip 2, while the second phosphor 6, which emits green, is applied to the first thin film as a second film, situated further away, in the potting resin 5.

Figure 3:
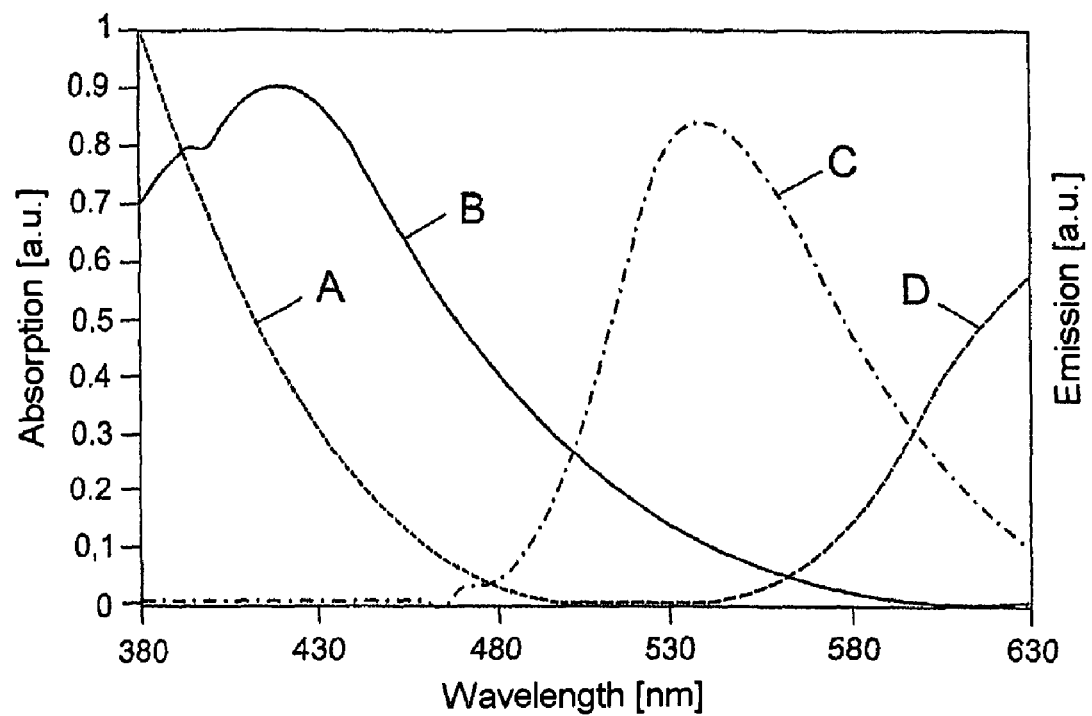
FIG. 3 diagrammatically depicts the absorption and emission properties of the first and second phosphors.
Figure 4:
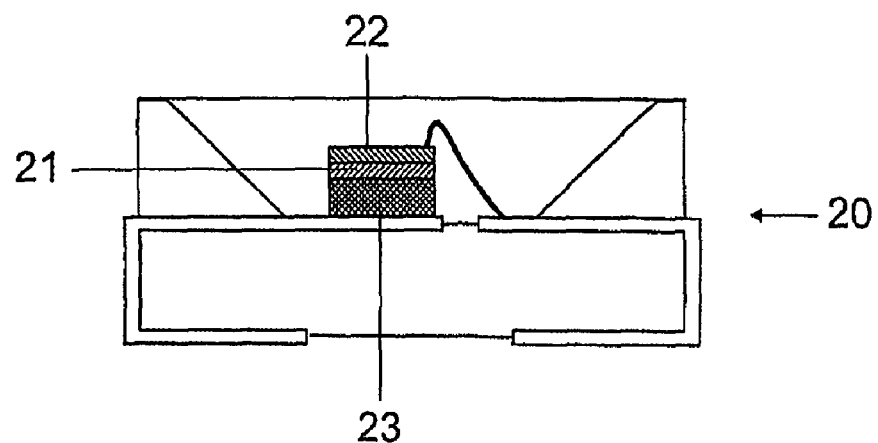
FIG. 4 shows an exemplary embodiment of a semiconductor component in accordance with the prior art.

FIG. 3 shows typical emission and absorption properties of blue-excitable phosphors as a function of the wavelength. The exemplary red phosphor is $(Sr,Ca)_2Si_5N_8$:Eu, and the exemplary green phosphor is Sr-Sion:Eu. The absorption B of the red phosphor significantly overlaps the green emission C. However, the absorption of the green phosphor A does not overlap the emission D of the red phosphor. Therefore, the efficiency rises if the red phosphor is applied direct to the chip while the green-yellow phosphor forms the outer, dispersed conversion element. In this context, the word significantly means that the efficiency rises by at least 2% if the two phosphors are separately connected ahead of the chip instead of forming a homogenous mixture.

A further system made up of two phosphors is a red-emitting nitridosilicate together with a green-yellow emitting chlorosilicate. Suitable chlorosilicates are known, for example, from DE-A 100 36 940.

This principle can also be employed to achieve specific colors with a high efficiency which can be produced as a mixture of red and green to yellow emitting phosphors. In this case, the chip can in particular also emit UV radiation.

Phosphors which absorb UV and emit in the visible spectral region often have the property of absorbing only in the UV, so that it is impossible for any reciprocal absorption to occur. This applies in particular to thiogallates and sulfides. Blue-absorbing phosphors have a much greater tendency to exhibit absorption with respect to one another, as illustrated in FIG. 3.

Typically, the first, red phosphor has a peak wavelength at 590 to 680 nm and has a full width at half maximum of 60 to 130 nm. Typically, the second phosphor has a peak wavelength at 490 to 580 nm and has a full width at half maximum of 30 to 135 nm. The primary radiation source used is in particular an InGaN chip, the peak wavelength of which is at 450 to 470 nm.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A luminescence conversion LED having a radiation-emitting chip, the primary radiation of the chip being UV to blue and being at least partially converted into longer-wave secondary radiation by a conversion element, wherein the conversion element comprises a separate arrangement of two phosphors, of which a first phosphor emits red secondary radiation and a second phosphor emits yellow to green secondary radiation, with only the first phosphor being applied directly to the chip, wherein a layer thickness of the first phosphor is at most 40 μm, and wherein the second phosphor is dispersed in a potting compound which has a layer thickness of at least 200 μm.

2. The LED as claimed in claim 1, wherein the first phosphor has a peak wavelength of emission at 590 to 680 nm and has a full width at half maximum of emission of 60 to 130 nm.

3. The LED as claimed in claim 1, wherein the second phosphor has a peak wavelength of emission at 490 to 580 nm and has a full width at half maximum of emission of 30 to 135 nm.

4. The LED as claimed in claim 1, wherein the chip has a peak wavelength at 450 to 470 nm.

5. The LED as claimed in claim 1, wherein the chip is surrounded by a housing, the chip being seated in a recess in the housing.

6. The LED as claimed in claim 1, wherein the chip includes a reflector for the emitted primary and secondary radiation.

7. The LED as claimed in claim 1, wherein the absorption of the first phosphor, which emits red secondary radiation, significantly overlaps the secondary emission of the second phosphor, which emits yellow to green secondary radiation.

* * * * *

UNITED STATES PATENT AND TRADEMARK OFFICE
CERTIFICATE OF CORRECTION

PATENT NO. : 7,804,237 B2
APPLICATION NO. : 11/919296
DATED : September 28, 2010
INVENTOR(S) : Bert Braune It is certified that error appears in the above-identified patent and that said Letters Patent is hereby corrected as shown below:

Title Page, Item (73) Assignee should read
        OSRAM Gesellschaft mit beschrankter Haftung
        Munich (DE)

OSRAM Opto Semiconductors GmbH
        Regensburg (DE)

Signed and Sealed this
Nineteenth Day of July, 2011

David J. Kappos
*Director of the United States Patent and Trademark Office*